US006184609B1

(12) United States Patent
Johansson et al.

(10) Patent No.: US 6,184,609 B1
(45) Date of Patent: Feb. 6, 2001

(54) PIEZOELECTRIC ACTUATOR OR MOTOR, METHOD THEREFOR AND METHOD FOR FABRICATION THEREOF

(75) Inventors: Stefan Johansson; Mats Bexell, both of Uppsala (SE)

(73) Assignee: Piezomotors Uppsala AB, Uppsala (SE)

( * ) Notice: Under 35 U.S.C. 154(b), the term of this patent shall be extended for 0 days.

(21) Appl. No.: 09/142,874

(22) PCT Filed: Mar. 26, 1997

(86) PCT No.: PCT/SE97/00541

§ 371 Date: Sep. 16, 1998

§ 102(e) Date: Sep. 16, 1998

(87) PCT Pub. No.: WO97/36366

PCT Pub. Date: Oct. 2, 1997

(30) Foreign Application Priority Data

Mar. 26, 1996 (WO) .................................. PCT/SE96/00391

(51) Int. Cl.$^7$ .................................................. H01L 41/08
(52) U.S. Cl. ............................................ 310/328; 310/367
(58) Field of Search ..................................... 310/328, 367

(56) References Cited

U.S. PATENT DOCUMENTS

| 4,639,630 | | 1/1987 | Rodloff et al. ................... 310/328 X |
|---|---|---|---|
| 4,727,278 | * | 2/1988 | Staufenberg, Jr. et al. ......... 310/328 |
| 4,928,030 | | 5/1990 | Culp ..................................... 310/328 |
| 5,027,028 | * | 6/1991 | Skipper ............................... 310/328 |
| 5,068,566 | * | 11/1991 | Cilp ..................................... 310/328 |
| 5,136,201 | * | 8/1992 | Culp ..................................... 310/328 |
| 5,144,187 | | 9/1992 | Culp ..................................... 310/328 |
| 5,262,696 | | 11/1993 | Culp ..................................... 310/328 |
| 5,323,082 | * | 6/1994 | Wright ................................. 310/328 |
| 5,325,010 | * | 6/1994 | Besocke et al. .................. 310/328 X |
| 5,345,137 | * | 9/1994 | Funakubo et al. ............... 310/328 X |
| 5,485,437 | * | 1/1996 | Gregg ............................... 310/328 X |
| 5,589,725 | | 12/1996 | Haertling ......................... 310/328 X |
| 5,598,050 | * | 1/1997 | Bowen et al. ....................... 310/367 |
| 5,668,432 | * | 9/1997 | Tominaga et al. ................... 310/328 |
| 5,745,278 | * | 4/1998 | LaFiandra ....................... 310/328 X |
| 5,747,915 | * | 5/1998 | Benavides ....................... 310/328 X |
| 5,798,600 | * | 8/1998 | Jager et al. ..................... 310/328 X |

FOREIGN PATENT DOCUMENTS

| 196 05 214 | * | 2/1996 | (DE) ................................... 310/328 |
|---|---|---|---|
| 32433358 | * | 10/1991 | (JP) ................................... 310/328 |
| 405175567 | * | 7/1993 | (JP) ................................... 310/328 |
| 9300305 | | 2/1993 | (SE) . |

OTHER PUBLICATIONS

The Micropositioning Book, Burleigh Instruments, Inc. Burleigh Park, Fishers, NY 14453, pp. 1–13, 1994.

"Characterization of an inchworm prototype motor", M. Bexell, A.L. Tiensuu, J. –A Schweitz, J. Doderkvist and S. Johansson.

Sensors and Actuators A, 43, 1994, pp. 322–329.

"A High Torque Miniature Inchworm Motor", M. Bexell and S. Johansson, Department of Technology, Uppsala University, Uppsala, Sweden, 1995, pp. 528–529.

* cited by examiner

*Primary Examiner*—Mark O. Budd
(74) *Attorney, Agent, or Firm*—Young & Thompson (57) ABSTRACT

This invention relates to an actuator or motor comprising an electromechanical material which alters its shape under the influence of an electrical voltage. Said actuator comprises at least a monolitic module (1,2) with electrodes integrated in said electromechanical material and in that the force or displacement due to the applied voltages is transferred, to the point to be actuated or moved by the shape change of the material, using at least two independent contact points. The invention also relates to a method for fabricating said actuator or motor.

21 Claims, 9 Drawing Sheets

PIEZOELECTRIC ACTUATOR OR MOTOR, METHOD THEREFOR AND METHOD FOR FABRICATION THEREOF

TECHNICAL FIELD OF THE INVENTION

The invention relates to small motors and actuators comprising electro-mechanical materials which alters its shape under the influence of an electric field. In particular the invention relates to motors and actuators in which the motion relative another body is created by repetition of small steps. The invention also relates to a method of driving such motors and to a method for manufacturing the motors.

RELATED ART

There is a great need for high performance motors in the size range below a few millimeters, motors of the kind which should be able to create linear and/or rotating motion. It is often desirable that this kind of motors both have a high precision and can exert large forces. One may realize that since reliable and cheap motors of this kind is requested for e.g. driving cameras, hard disks, CD-players etc the potential market is huge. Also in the area of medical instrumentation, e.g. pumps, such motors are of great interest.

In the state of the art, various devices based on electro-mechanical materials exist. Electromechanical materials have the interesting property of changing its shape when they are influenced by an electric field. Pieces of electro-mechanical materials, fixed to a base plate will therefore move their non fixed surfaces when electric fields are applied to them. Such motions, contractions or expansions, may be used for constructing different types of motors or actuators.

Techniques often used for motors in the size range one centimeter and above are referred to as ultrasonic motor techiques. Other terms often used for the same kind of devices are resonance, vibration, travelling wave or impact motor devices. Typically, in such motors, electromechanical materials impose a resonance vibration into itself and a solid piece material, normally a metal block. In e.g. a travelling wave motor, protruding portions of the metal block are forced into an elliptical movement, and another object in contact with these protruding portions is forced to move in accordance with these movements. When going to miniature motors, this technique will be disadvantageous, since the movements become too small and limited by a non-controllable surface topography etc.

A more appropriate approach to miniature motors based on electromechanical materials is to use devices which operate off the inherent resonance. One particular actuation principle which has a great potential to fulfil the demands for such motors is an Inchworm® type of motor (M. Bexell, A.-L. Tiensuu, J-A. Schweitz, J. Söderkvist, and S. Johansson, Sensors and Actuators A, 43 (1994) 322–329). The motion is created by repetition of small steps in a similar way to the insect inchworm, hence the name (The micropositioning book. Fishers, N.Y.: Burleigh Instruments, Inc. (1990)). This motion principle will in the remaining part of this appplication be referred to as a "non-resonance step" technique, to be distinguished from the above described ultrasonic techniques. Portions of electromechanical material may also be referred to as PZT.

The principle for this motion is simple. A moving body is held between two claws, one on each side of the moving body. Each claw consists of a longitudinal piece of PZT, substantially parallel to the moving body, and at each end a transversal PZT is present. The PZT:s are assembled onto metal bodies. Assuming all of the transversal PZT:s are energized and expanded in the start position, gripping the moving body, the two opposite front transversal PZT:s are recontracted, loosing the grip of the moving body. An electrical field is applied to the longitudinal PZT:s, expanding their lenghts, and the front transversal PZT:s are subsequently forced to expand again, gripping the moving body at a new position. The rear transversal PZT:s loose their grip of the moving body and the longitudinal PZT:s are allowed to contract again, whereafter the rear PZT:s again grip the body. The result of such a cycle is that the moving body has moved relative to the two claws.

An electronic control device is needed for a controlled operation of the above actuator. The electronics should supply the different PZT:s with appropriate voltages in an appropriate order. Since such a sequence of voltages can be repeated very fast, a relatively fast movement is possible to obtain despite the small step size.

There are some crucial factors limiting the development of existing products based on the non-resonance step principle. Among the limits there is the difficulty of achieving a sufficient stroke of the individual actuating elements and the need for a costly high precision assembly of the elements and other parts in the system. Some solutions to these problems have been presented in the Swedish Patent Application No. 9300305-1 by Johansson. Using actuating elements with at least a two-axial motion capacity, the number of elements has been reduced. At the same time motion magnification by internal levers (e.g. bimorphs) in the elements can be included which gives a large freedom in design. According to these ideas a miniature motor has been built and has proven to present the desired high torque and motion capacity as predicted (M. Bexell and S. Johansson, Transducers, Stockholm, Sweden (1995) 528-News).

By the above mentioned solution, a motion relative to another body may be acheived in the following way. Four active elements of electromechanical material are mounted on a passive base plate, normally made of silicon, and the moving body is held against the protruding active elements. All elements consist of two vertically divided controlled portions of PZT, both extending between the base plate and the moving body. By applying a voltage resulting in an electrical field in the horisontal direction to the first portion of the PZT but not to the other portion, one part is tending to contract in the vertical direction, while the other is unaltered. Since the two portions are mechanically integrated into one piece, the active element will subsequently bend towards the side of the live portion. If both portions are energized, the whole element will contract, and if only the second PZT is imposed by a voltage, the element will bend in the other direction. By varying the voltage in the different portions, a contact point on the top of the active element can travel along any path within a rhombic area. A "contact point" is of course not a point in a mathematical sense, but rather a small "contact area" depending on the actual geometries and normal forces, and these expressions are in the present description used in a synonomous manner.

By using four active elements arranged after each other, in the direction of the sidewise movement, a moving action on the body can be acheived. By letting the first and third elements move in phase, and moving the second and fourth elements out of phase, a non-resonance step motion similar to the above described, is acheived.

At present, this motor gives the highest torque per volume of all presently known miniature motors. There are some disadvantages even with this construction, which is the origin of the present invention. In the previous patent application the motor, for instance, consisted of active elements mounted on a substrate, and typically soldering has been used as the assembling method. This is a fairly time consuming operation and therefore costly. Most applications demand however that the price of each motor should be very low.

The above patent application, bimorph or multimorph elements were used to obtain two-axial motion and at the same time possibility for stroke magnification. The disadvantage with a single clamped bimorph is that the force capacity is greatly reduced in comparison with an ideal lever, which is the reason why these types of elements normally are used for positioning when there is no considerable need for forces. A double clamped bimorph, a curved membrane or an arch-shaped structure have a better force capacity for a given stroke magnification, as disclosed in the U.S. Pat. No. 5,589,725. However, no completely satisfying design for these leverage structures has been presented yet. Either they are too expensive to produce (for instance assembling) or the performance is not sufficient.

One important application for miniature motors is in catheter type of instruments (for medical use). The problem is how to control the shape of a long narrow tube. Either the tube is the instrument itself or is an aid for other catheter type of instruments. There exist only a few suggestions or examples of how to control the motion of a tube type structure of dimensions less than a diameter of 5 mm. All suggestions have obvious disadvantages. Either the motion is too slow, the tube too weak or results in too much heating.

Multilayered structures of piezoelectric materials conventially are fabricated in a following manner. A green tape is made by tape casting a mixture of piezoelectric powder and a polymer binder. An electrode pattern is defined by screen printing a metal paste on to the green tape. The multilayer is made by laminating these tapes and subsequently heat treat the structure in two steps, first a polymer burn out and secondly sintering, to create a monolithic unit. The outer shape is most commonly cut by a sharp wedge in the green state but other shaping techniques, such as drilling, cutting and punching, could be used as well. The contacts to the different electrode layers are made subsequently to the sintering by printing or painting metal paste on the sides, orthogonally to the layers, and a subsequent heat treatment of the paste forms a metal.

In a major part of the future applications for miniature motors the fabrication has to be cheap. Present microfabrication techniques are rather expensive and yet far from suited for making cheap active components. The main needs are electrode patterning and electric interlayer connection in the electroactive material.

SUMMARY OF THE INVENTION

One object of the present invention is to provide a motor or actuator, using the non-resonance step principle, which comprises as small a number of separate elements as possible, maintaining or improving the precision of the motion of the device. It is also an object of the present invention to provide manufacturing methods for such motors or actuators.

Another object of the present invention is to provide a motor or actuator which can be further miniaturised.

A further object of the present invention is to provide a motor or actuator, which can achieve a large range of combined motions.

The above objects are acheived by a motor or actuator according to claim 1. An actuator or motor comprises electromechanical material providing the moving action, whereby the motion is created by repeatedly performing small steps. The actuator comprises at least one monolithic module with electrodes integrated in the electromechanical material. The term "monolithic" will in this description stand for one single integral body, finally integrated by a heat treatment, e.g. a sintered block of different materials. The actuator has at least two contact points with a moving body, contact points of which can be positioned independently of each other relative to a passive part in the monolithic module in at least two independent directions. The module can by itself or in combinations with other modules be used for moving another body.

The manufacturing method according to the present invention is a method for creating complex electrode arrangements in a ceramic body, such as an electromechanical material, which method comprises replication of a geometrical shape into a polymer tape with grains of electromechanical material. This replication accomplishes the three dimensional patterning of the modules.

BRIEF DESCRIPTION OF THE DRAWINGS

The invention will now be described in more detail with reference to the accompanying drawings, in which.

DETAILED DESCRIPTION OF EMBODIMENTS

Figure 1:
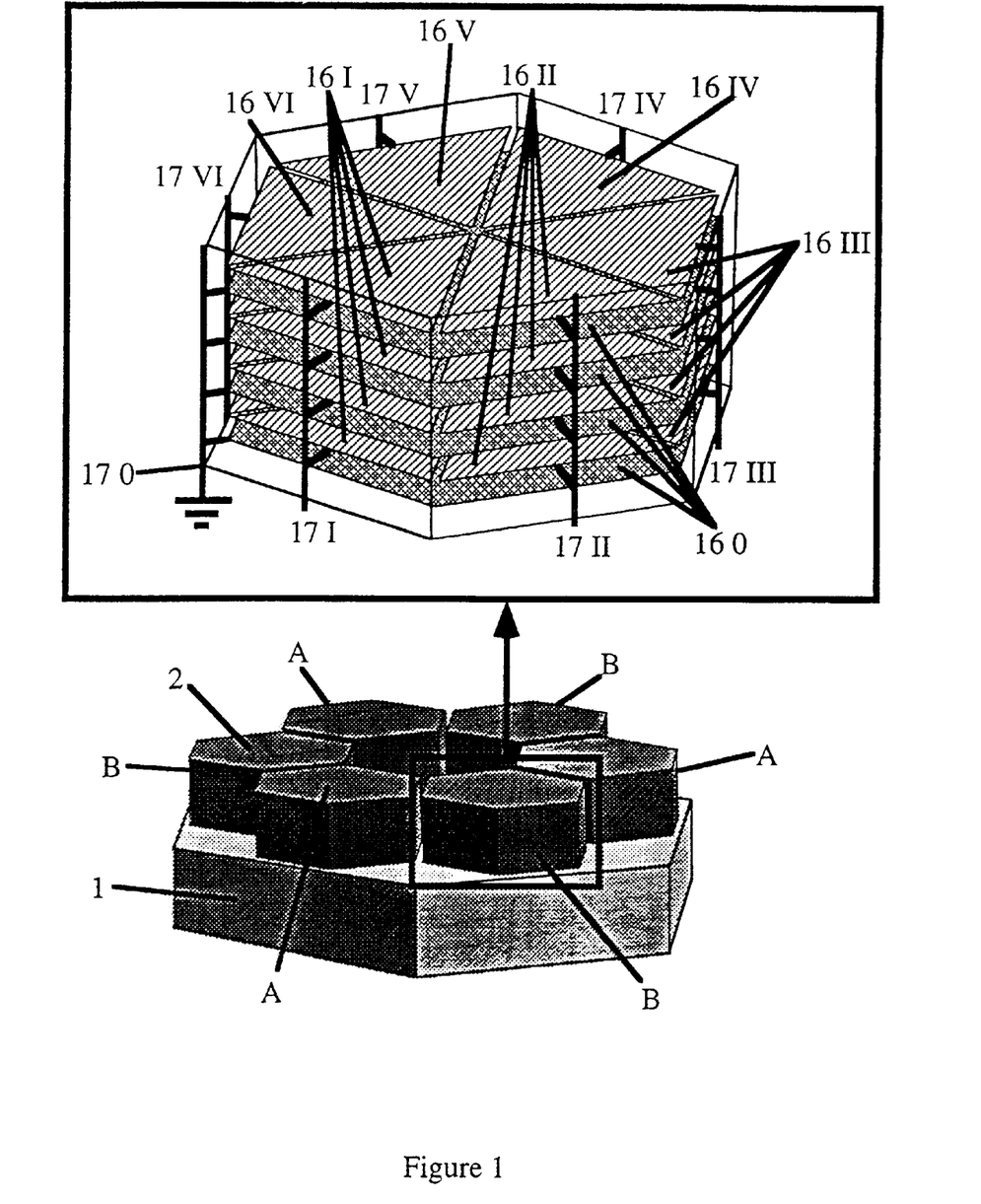
FIG. 1 is a preferred embodiment of a hexagonal, monolithic structure according to the invention.

A preferred embodiment of the invention is illustrated in FIG. 1, which discloses a monolithic module integrating all the active elements. The monolithic module can be described in terms of a larger hexagonal mechanically passive part 1 and active elements 2, which are integral parts of the module. Therefore none of the parts shown in FIG. 1 are possible to dismount, since they together form the monolithic module. The active elements 2 are arranged to be in contact with, or at least in the vicinity of the surface of the body which is supposed to be moved relative to the module (not shown in the figure).

Each element 2 consists of an electromechanical material, preferably piezoelectric, which typically is a multilayered structure. An electromechanical material responds to a certain electrical field applied across it. In order to have a large shape change upon applying the voltage, the electrical field in each portion of the material has to be high. For a non-layered material, a single voltage has to be applied across the whole structure, why the requested voltages have to be very high. One of the advantages with a layered structure is that the necessary voltages to achieve a particular electrical field becomes lower, which is desired for the matching of the structure with, e.g., the drive electronics. This is accomplished by introducing electrode and earth layers within the material. Upon supplying a relatively low voltage to each electrode, the local electrical field can still be high enough for a large shape change.

A possible configuration of such a layered structure is shown in the upper part of FIG. 1, where an enlarged sketch of one of the elements is shown. Electrical contacts 17I–17VI are connected to electrodes 16I–16VI and a ground contact 17 O with ground layers 16 O in between the electromechanical layers in the figure. The electromechanical layers in the figure are drawn as a transparent volume for the sake of clarity, even though the electromechanical material in reality not being transparent. The whole piece shown in the enlarged picture, including the electrodes, contacting etc. are integral parts of the entire monolithic module.

With the above described configuration of the active elements 2, each active element 2 can be forced to move in three independent directions. By applying the same voltage to all electrodes 17I–17VI, the entire active element 2 elongates its height, i.e., the contact point against the body to be moved is moved upwards. By, for instance, applying a voltage to the electrodes 17I and 17II, the corresponding portion of the electromechanical material will try to elongate in height, while the other portions are unchanged. In the Figure, this situation will result in a tilting of the active element 2 inwards, thus moving the contact point inwards and somewhat upwards. Similarly, by applying a voltage to the electrodes 17II–17IV, the active element 2 is forced to bend to the left side in FIG. 1. By combining such movements, the contact point of the active element 2 can be forced to move in an arbitrary direction, within certain limits.

Thus, the use of electrode arrangements such as illustrated in FIG. 1 allows the element top surface to move arbitrarily in space relative to the substrate. If there are at least two independent sets of active element, arranged for instance as A and B in FIG. 1, then the module can easily be used with an non-resonance step technique type of motor.

One example of such a motion is a rotational one. Assume a body to be moved is placed on top of the active elements 2, having one contact point for each element 2 when not active. The stepping cycle starts with elongating the active elements of set A, whereby only the three contact points with A elements remain. Then the set A elements are activated in such a way that they all are bent in parallel to the closest edge of the hexagonal passive part 1. The moving body will then rotate a small angle around an axis going through the center of the module. The set B elements are put in contact with the moving body and the set A is contracted and straightened. The cycle then continues by bending the B set, and so on.

A linear motion may also be accomplished by instead bending the sets of elements in a certain direction. It is easily understood that any arbitrary motion within the plane of the active elements may be acheived in this way.

In the above examples, the elements are assumed to be driven by constant voltage pulses, but typically in reality all elements are driven with sinusoidal voltages to achieve an elliptical motion of the element contact point relative to the substrate. The two sets A and B are then typically rotating about 180 degrees out of phase. For each element there are at least two phases and a simple arrangement in FIG. 1 would be to drive electrodes I and VI with one sinusoidal wave and III and IV with another. These should be phase shifted about 90 degrees to obtain a suitable elliptical motion of the contact point. There are of course numerous ways to arrange the electrodes in the active elements and to apply voltages to the contacts in order to achieve a motion according to the non-resonance step technique.

The actual electronics may be constructed according to conventional methods and will not be further discussed in this application.

It is also desirable to integrate the control electronics generating the phase shifted voltages as well as various sensor (e.g. force and position) feed-back and communication electronics into the integrated module or attached thereto. In such a way a specially taylored electromechanical actuator module may be available as one monolithicpiece.

The actuator according to an embodiment of the present invention is advantageously used for medical instruments of catheter type. Assuming that control and communication electronics are integrated within (or mounted on) the module, an arrangement such as shown, e.g., in FIG. 2 solves previous problems. The arrangement comprises a number of modules according to the present invention, where the whole module 1 has a wedge shape, typically with the back side 3 tilted. The wedge shape could be either the module itself or a separate unit, free or mounted on the module. It is also convenient to use an elastic material or an elastic structure (e.g. spring type of geometry) in-between or as the wedge shaped unit.

Figure 2:
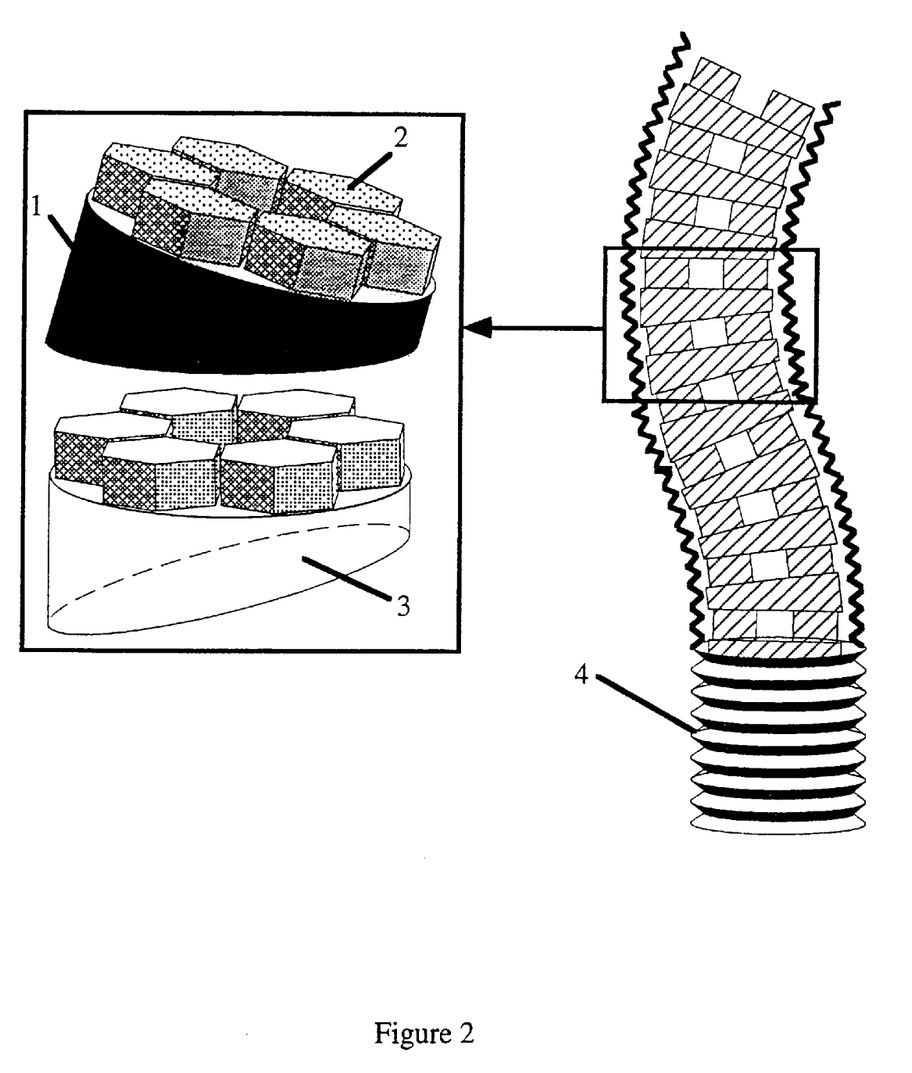
FIG. 2 illustrates an embodiment in the form of a tube, with controllable shape.

A number of different movement modes are easily obtainable by such an arrangement. If the modules are rotated relative to each other, a tilting action of the total arrangement results.

This means that a rotational movement of one of the modules will convey the above arranged modules along circular paths, the radius of which in relation to the distance to the rotating module will correspond to the wedge angle. A clarifying example is the case where the arrangement above the rotating module is linear. In such a case the upper part of the arrangement will follow the surface of a cone.

Two modules operating together can create rotation without tilting. This is obtained by arranging the two wedges in oposite directions, so that the wedge angles compensate each other. In such a way a rotational movement may be transferred further in the arrangement of FIG. 2.

One possible solution for assembly of such a system would be to enclose the modules including the wedges into a bellow-shaped tube 4. The tube is creating the normal force in-between the many modules. At the same time it serves as a protective envelope and electrical connection.

All modules could be connected to a serial communication bus (e.g. 2–4 electrical wires) to reduce the number of electrical connections between the modules.

Figure 3:
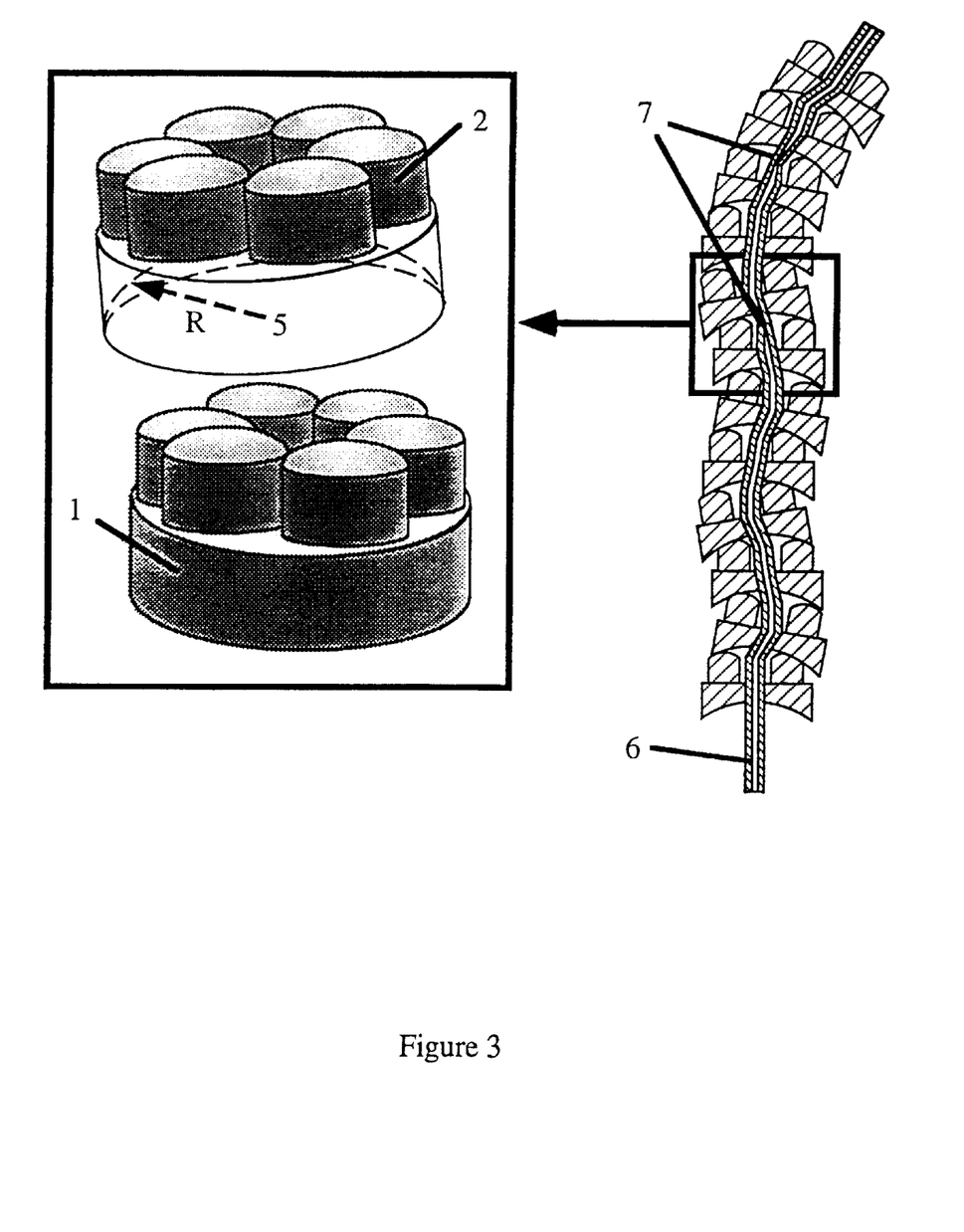
FIG. 3 is a variant of the embodiment according to FIG. 2 including a concentric inner tube with a peristaltic internal motion.

Another elegant catheter design is to use modules with a spherical contact surface, as illustrated in FIG. 3. The spherical contact surface 5 makes it possible to rotate each module relative to the next without any tilting. It is also possible to tilt each individual module in any direction if three-axial active elements are used. This corresponds to the linear motion described in connection with FIG. 1. The catheter will be more flexible in comparison to the previous design, FIG. 2. However, the wedge shaped design is much easier to manufacture, which might be an advantage in some applications.

There is also a desire to transport for instance liquids in and out through the catheter working end. This could be achieved with a tube 6 in the centre of the modules, FIG. 3. A peristaltic type of liquid transport may be obtained if two tube constrictions 7, separated by a certain distance, are moving together. Constrictions can be made by tube rotation or stretching using the modules. By moving the individual modules according to a certain scheme it is possible to move such constrictions along the arrangement, and if both constrictions are moved together, the volume enclosed in-between, will be brought through the center of the arrangement.

Figure 4:
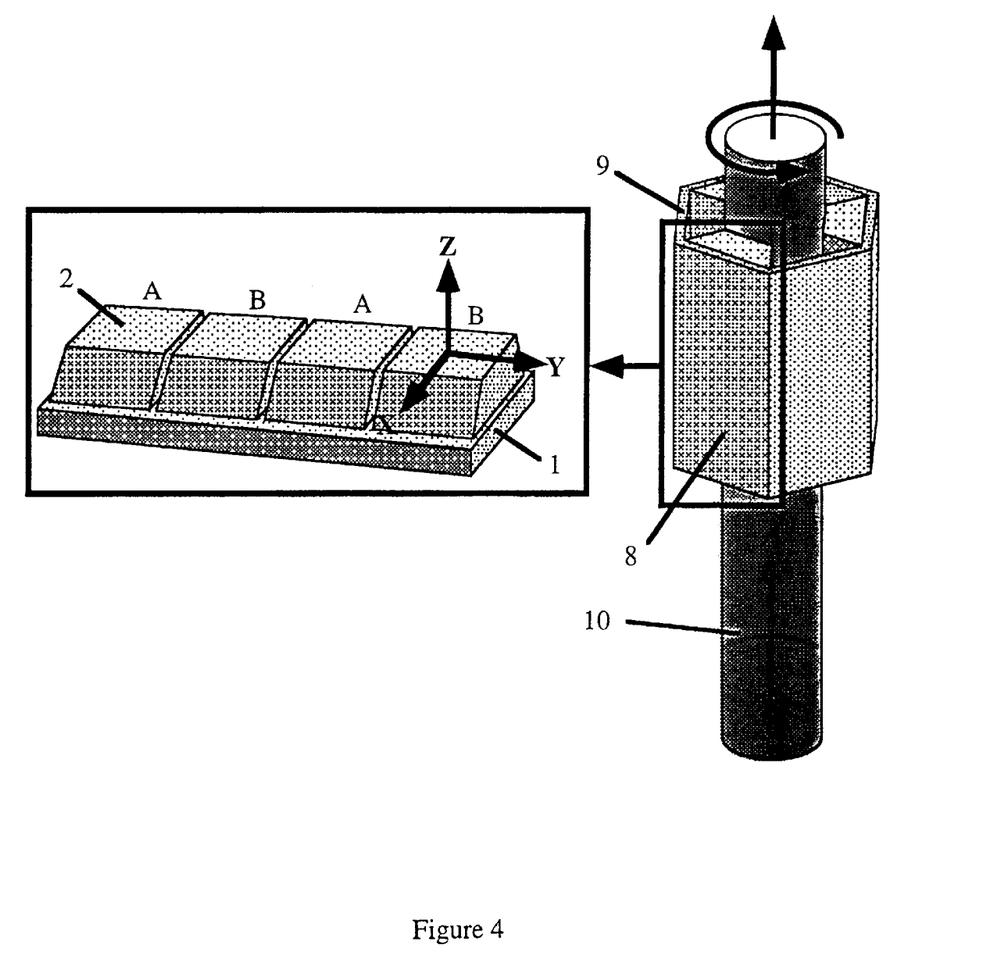
FIG. 4 shows an embodiment allowing a combined rotating and linear motion.

Among the high performance applications are, e.g., linear motion in fast, high precision equipment. One such design is shown in FIG. 4. It consists of three modules assembled into a stator structure 8. The stator structure has a geometry that creates a radial force against the rotor 10 by spring type elements 9. If the active elements in the module are made for three-axial motion as indicated in the figure, then both axial motion and rotation of the rotor can be achieved. As seen in the enlarged module, the four active elements are divided into two sets. This is also done for the two other modules of the motor. These two sets of active elements forms gripping claws in analogy with the non-resonance step principle motion, in analogy with the description of FIG. 1. If the active elements in each set are bent in a tangential direction during operation, the resulting motion of the rotor will be a rotation. If the active elements in each set are bent in an axial direction during operation, the resulting motion of the rotor will be a axial translation. Of course, these two motion modes may be combined simultaneously, by letting the active elements in the modules bend in a direction between the two pure motion cases.

A simple rotating motor can be constructed in an analogous way using two spring loaded structures similar to those of FIG. 1 with a rotor in the middle. In the simplest version the contact points ot two monolithic modules are pressed with a clamping spring structure against either side of a planar rotor disc. If a hole is, e.g., drilled through the monolithic module, the rotor shaft connected to the rotor disc could go orthogonally to the module in the centre.

A body to be moved by the module is actually moved by a friction type of force. To acheive such a force, some kind of normal force towards the module is necessary. The normal force necessary to create motion in between the stator and rotor, i.e between a module and the body to be moved in relation to the module, can be acheived in many ways. All types of forces can be used: gravitation, magnetic, electrostatic, molecular, atomic, viscous forces. The elastic forces in springs are of course attractive for many applications but the use of permanent magnets might be one of the most cost-efficient methods. By elastic springs are understood all mechanical arrangements which presses the moving body against the modules. These "springs" normally constitute the surrounding encompassing material. They may, however, reqiure some amount of mounting effort, which may make such solutions less cost efficient.

The motion range of each active element in the modules is an extremely important parameter. A large enough motion range in relation to the fabrication precision and accuracy is needed. While the element construction given in FIG. 1 might be sufficient for certain motor sizes, some stroke magnification mechanism must be used when the motor is further miniaturised.

Figure 5:
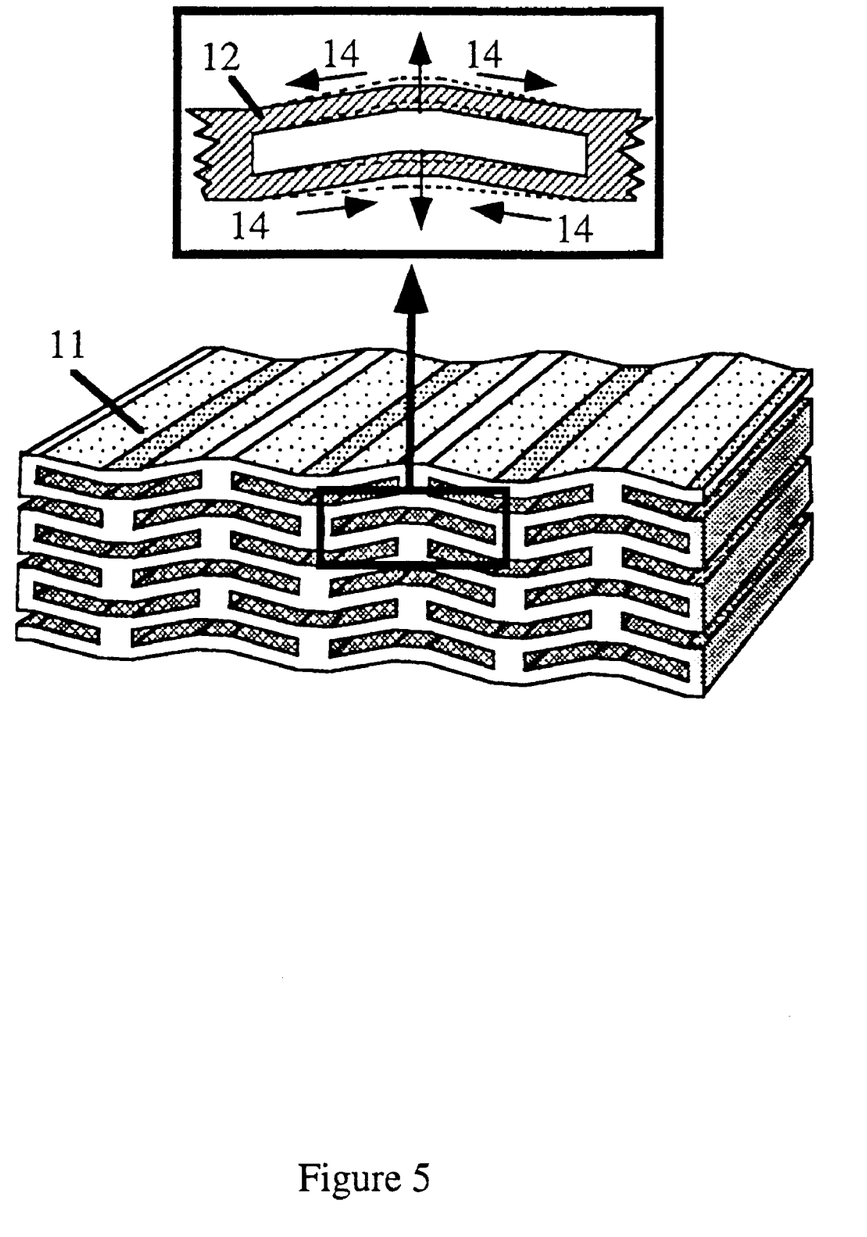
FIG. 5 shows an arch-shaped structure with an improved force capacity for a given stroke magnification.

In devices according to the state of the art some stroke magnification efforts are done, however, quite insufficient. The leverage structure 11 schematically presented in FIG. 5 solves all these problems. It is a monolithic body consisting of arch-shaped structures arranged with two oppositely oriented arches 12 as a base unit. The arches are typically of electroactive material with layers of electrodes and connected in such a way that, for a given applied voltage, one arch increases its curvature and the other arch decreases its curvature. In that way the entire body will expand in the vertical direction and horizontal forces 14 will be compensated for. The horizontal forces are, e.g., due to horizontal shape changes to accomplish the change of curvature. Since one arch decreases its curvature and the other increases its curvature, the resulting forces will have opposite signs in the horizontal direction, and hence are compensated within each base unit. By intelligent distribution of the electrodes in the module three axial motion is acheived. For instance, the electrode areas in each arch could be divided in analogy with the active elements 2 in the monolithic module 1 and hence the central portion which is used for the transfer of force and displacement will be possible to move also in a horizontal direction. The volume in between the arches is either empty or filled with suitable elastic material. An elastic material such as a rubber will serve e.g. as a protection against overloading without a substantial loss of actuator performance.

Figure 6:
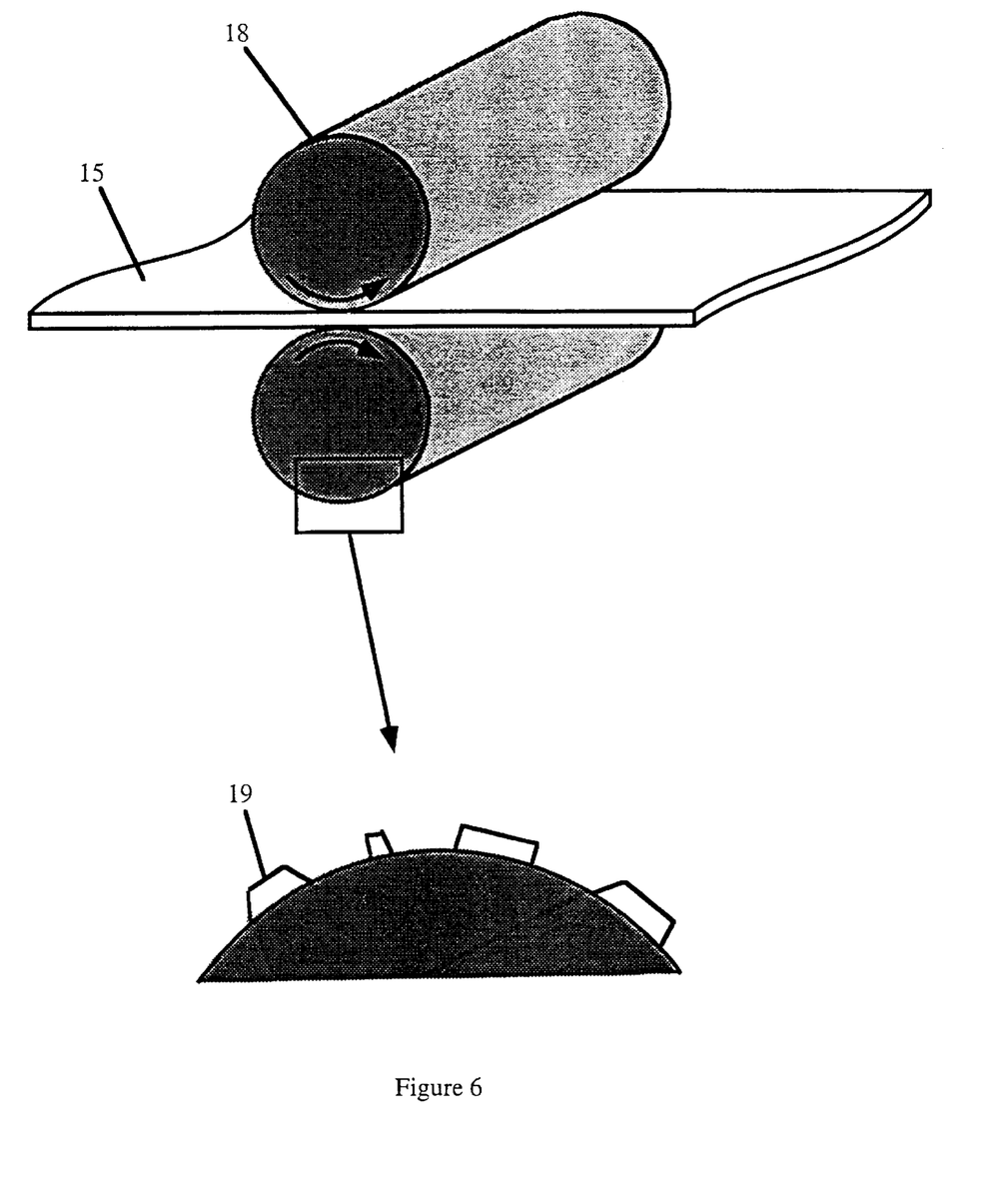
FIG. 6 illustrates a rolling process to define the shape of an electroactive tape.

According to the present invention a method of fabrication of monolithic modules is disclosed. In this method there is of course a desire to directly form the monolithic module to its final shape, including internal voids or similar. In FIGS. 6–9, some possible processing techniques to solve these problems are described. In FIG. 6 rollers 18 with geometrical shapes 19 are used for replication of these shapes into a tape of electro-mechanical material 15. An alternative to rollers is the use of the somewhat slower stamping process, which has the advantage of a cheaper tool fabrication. The shapes fabricated by the replication process are principally used for definition of electrode layers and connections between layers in the green state, i.e., before heat treatment. Other uses of the replication technique is as an aid for alignment, and to define void volumes, which is further described below.

Figure 7:
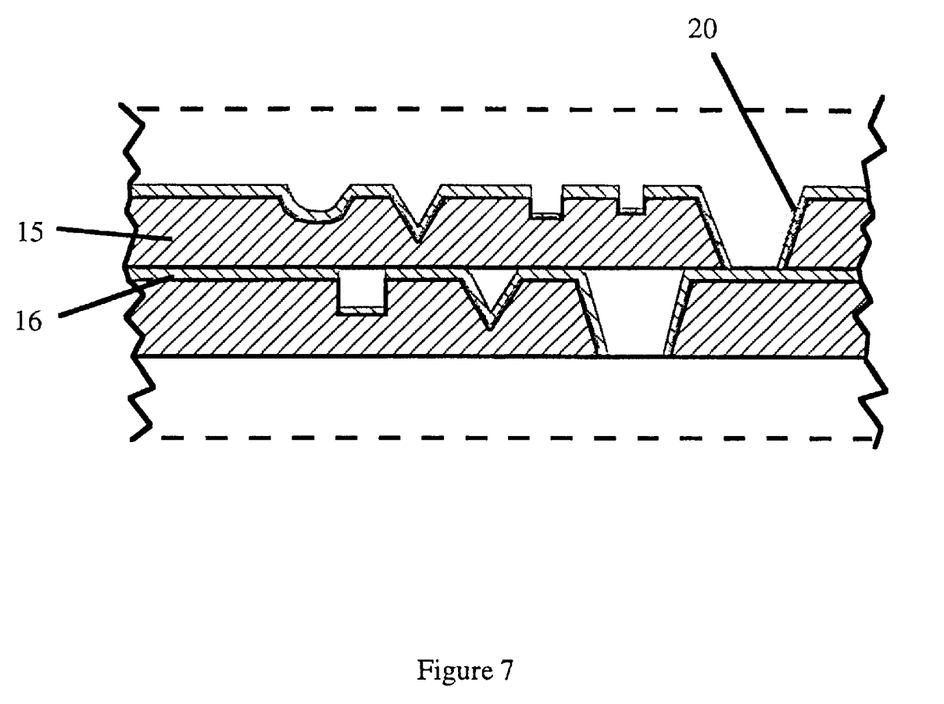
FIG. 7 shows some of the resulting geometries of a plastically deformed tape of electroactive material coated with an electrode layer.
Figure 8:
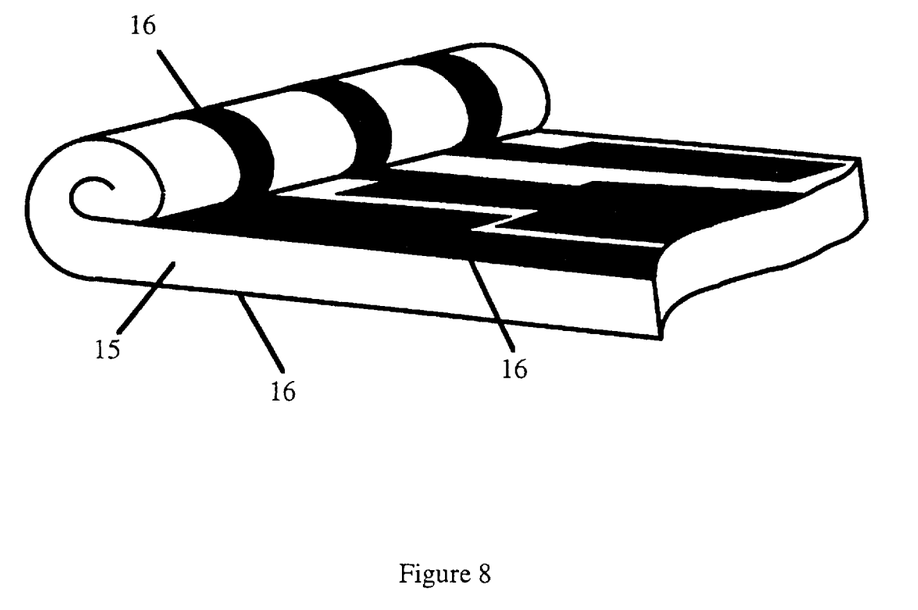
FIG. 8 shows a further method of producing an actuator according to the invention.

Depending on the actual application, the tape may be covered with electrode layers 16 as shown in FIG. 7, prior to the above described replication. If the tape is covered with electrode layers 16, either on one or on both sides, the patterning of the electrodes can then be made directly by the rolling process, FIG. 7. The electrode layer is divided by plastic deformation of the tape resulting in separate electrode areas, as can be seen in FIG. 1. The electrode patterning on top of, e.g., a polymer tape with piezoelectric grains is normally difficult by means of standard litographic techniques according to the state of the art, and the method according to the present invention solves this problem in an elegant way.

Electrical connection between the layers can also be made by forming holes 20 by plastic deformation of the tape. In FIG. 7, the walls of the hole 20 are still covered with electrode material and an electric connection is formed between the two layers. Alternatively, a hole formed in the above described way may be filled with electrically conducting paste. In this way electrical connections may be produced not only horizontally, but also vertically through the modules. Another method for formation of electrical connections would be to use rolling, see FIG. 8, folding, twisting etc. in combination with plastic deformation to achieve the desired electrical connection. In the manufacture of actuators based on electromechanical materials, one of the time consuming and overall limiting processing steps is the electrical connection between the layers. Simple folding, where two different parallel layers are connected in the fold itself, solves this problem in certain applications since there will be no need for connections inbetween the layers. Rolling and twisting of the polymer tape with electroactive material are other methods for formation of electrical connections inbetween different layers without forming holes.

Subsequent processing steps are to laminate these layers and by heat treatment produce a monolithic unit or module, methods known per se. These steps are therefore not further discussed in this disclosure. Internal void volumes (or suitable materials) could be made by including layers with non-electroactive material. Such layers may be introduced before or after the replication step as well as during the laminating step. By the replication, polymer volumes of different geometries are created. During heat-treatment, in particular the conventional introductional burnout heat treament, a polymer material would disappear, for instance. A void volume is thus possible to create by introducing a patterned polymer layer with aid of the replication technique.

External friction layers, suitable at the top of the active elements of the module, etc. could be included in the same manner. Since the outer parts of the active elements are the portions of the modules which are in mechanical contact with the moving body, these are the only parts of the modules, which are exposed to tribological effects. However, since the moving action is dependent on a certain friction, there has to be some sort of contact. One way to improve the resistance to wear etc. could then be to cover the outermost parts of the active elements with external friction layers. Such layers are also easily introduced in the fabrication method according to the present invention, by adding one or several layers of wear resistant material on top of the final electromechanical layers. The friction layers are subsequently integrated into the module during the sintering process.

Figure 9:
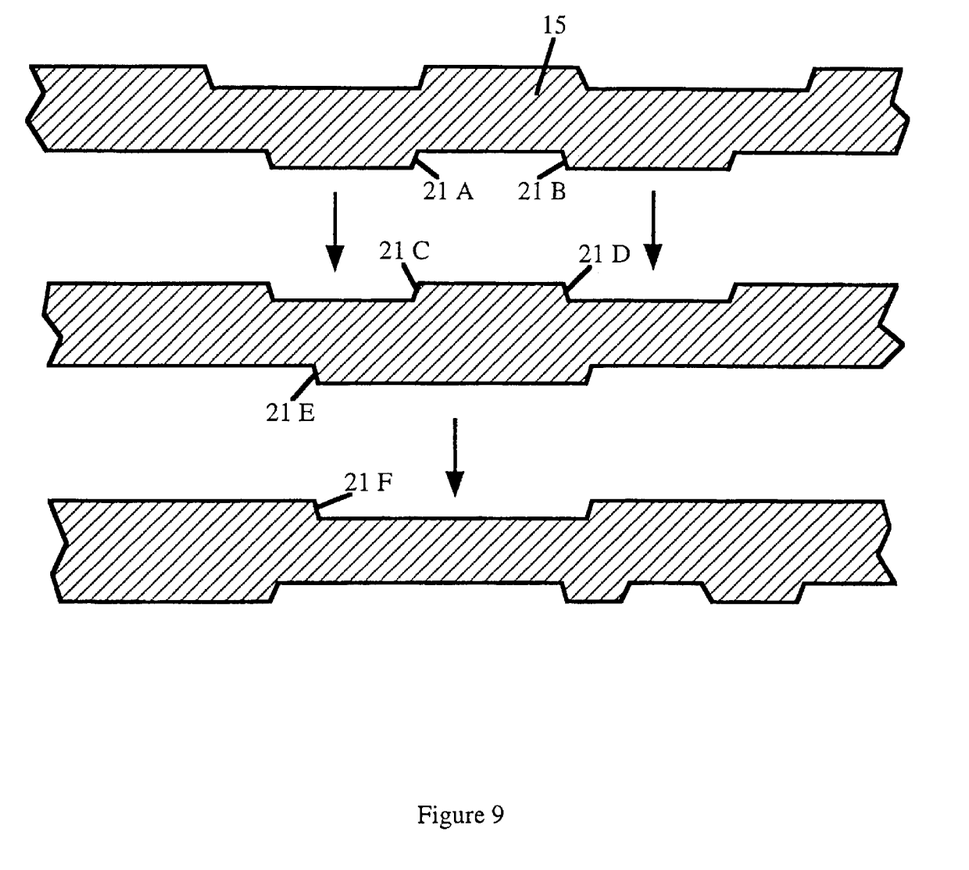
FIG. 9 shows alignment geometries in films used as starting materials.

One difficult step in the manufacturing process is the alignment of the different lamination layers prior to the heat treatments. Since the allover accuracy has to be in the order of $\mu$m, a corresponding accuracy has to be obtained during the alignment process. Alignment during lamination can be greatly simplified if particular alignment geometries 21, e.g. peg in hole, also are replicated in the film. From FIG. 9, it is seen that geometrical structures can assist in the alignment procedure. In FIG. 9, certain geometrical edges on three layers in series are denoted by 21A–21F. Protruding edges, 21A, 21B and 21E, correspond to recess edges, 21C, 21D and 21F, respectively, in the underlying layer. When positioning such layers on top of each other, these edges will fit together and guide the layers to be accurately aligned.

Although certain preferred embodiments of the invention have been presented in the above description, it should be noted that the invention is not limited thereto. It is understood that variations and modifications according to the spirit of the invention should be included and the invention is solely defined by the scope of the appended claims.

What is claimed is:

1. An actuator or motor having electromechanical material which alters its shape under the influence of an electric field, whereby motion relative a body is created by non-resonant repetition of small steps, said actuator or motor comprising at least one monolithic module with electrodes integrated in said electromechanical material, said monolithic module being a sintered block and having at least one passive part and at least two active elements, one independent contact point at each active element being provided against said body, which contact points are positionable independently of each other in at least two independent directions relative to said passive part of said monolithic module, whereby said monolithic module by itself or in combination with others is used for creating said motion.

2. An actuator or motor according to claim 1, wherein said contact points are positionable independently of each other, relative to said passive part of the monolithic module, in three independent directions.

3. An actuator or motor according to claim 1, wherein said contact points of the monolithic modules are located in a plane being inclined relative to a base plane of said monolithic module or an attached unit.

4. An actuator or motor according to claim 1, wherein said monolithic modules have a spherical contact geometry.

5. An actuator or motor according to claim 3, further including a bellow shaped tube, structured and arranged to create a normal force between said monolithic modules.

6. An actuator or motor according to claim 1, wherein said monolithic modules are pressed against said body.

7. An actuator or motor according to claim 6, wherein said monolithic modules are pressed against said body by gravitational, electrostatic, molecular, atomic or viscous forces.

8. An actuator or motor according to claim 6, wherein said monolithic modules are pressed against said body by magnetic forces.

9. An actuator or motor according to claim 6, wherein said monolithic modules are pressed against said body by elastic spring forces.

10. An actuator or motor according to claim 1, wherein three dimensional cavities are integrated in said monolithic modules.

11. An actuator or motor according to claim 10, wherein at least a part of said active elements is built-up by base units, comprising structures, which are curved in two or in three dimensions.

12. An actuator or motor according to claim 10, wherein at least a part of said active elements is built-up by arch-shaped structures which are fixed to each other at at least two ends.

13. An actuator or motor according to claim 11, wherein said base units are curved membranes or plate structures.

14. An actuator or motor according to claim 10, wherein said cavities are filled with rubber-like material.

15. An actuator or motor according to claim 1, wherein said monolithic module also comprises control electronics generating phase shifted voltages and various feed-back and communication electronics of a sensor, said sensor measuring at least one characteristic such as force and position.

16. An actuator or motor arrangement having an actuator or motor having electromechanical material which alters its shape under the influence of an electric field, and a body, whereby motion relative said body is created by non-resonant repetition of small steps, said actuator or motor comprising at least one monolithic module with electrodes integrated in said electromechanical material, said monolithic module being a sintered block and having at least one passive part and at least two active elements, one independent contact point at each active element being against said body, which contact points are positionable independently of each other in at least two independent directions relative to said passive part of said monolithic module, whereby said monolithic module by itself or in combination with others is used for creating said motion, and in that said body has a wedge shape.

17. An actuator or motor according to claim 16, wherein said body comprises an elastic material.

18. An actuator or motor according to claim 16, wherein said body is an elastic structure.

19. An actuator system having a number of modules comprising electromechanical material which alters its shape under the influence of an electric field, whereby motion relative a body is created by non-resonant repetition of small steps, said modules being monolithic modules with electrodes integrated in said electromechanical material, each of said monolithic modules being a sintered block and having at least one passive part and at least two active elements, one independent contact point at each active element being provided against said body, which contact points are positionable independently of each other in at least two independent directions relative to said passive part of said monolithic module, and a bellow-shaped tube arranged for creating a normal force between said monolithic modules.

20. Method of driving an actuator or motor having electromechanical material altering its shape under the influence of an electric field, comprising the step of moving said actuator or motor by repeating small steps, said step of moving further comprises the step of driving at least one monolithic module by itself or in combination with other monolithic modules, said monolithic module being a sintered block and having electrodes integrated in said electromechanical material, positioning at least two contact points on each of said monolithic modules independently of each other in at least two independent directions relative to a passive part of said monolithic modules, and the step of rotating at least one of said monolithic modules relative to another, having a wedge shape, or relative to a separate unit having a wedge shape, thereby transferring a rotating motion into a tilting motion.

21. Method of driving an actuator or motor according to claim 20, wherein said step of rotating comprises the steps of creation and moving of constrictions of a central tube, causing peristaltic motion of any liquids within said central tube.

* * * * *